United States Patent [19]

Kubota et al.

[11] Patent Number: 5,202,893
[45] Date of Patent: Apr. 13, 1993

[54] END PUMPED SOLID-STATE LASER

[75] Inventors: Shigeo Kubota, Tokyo; Yushi Kaneda, Kanagawa, both of Japan

[73] Assignee: Sony Corporation, Tokyo, Japan

[21] Appl. No.: 732,649

[22] Filed: Jul. 19, 1991

[30] Foreign Application Priority Data

Jul. 30, 1990 [JP] Japan ................... 2-202049

[51] Int. Cl.$^5$ .............................. H01S 3/04
[52] U.S. Cl. .................. 372/34; 372/101; 372/102; 372/69; 372/23; 372/6; 372/71; 372/75
[58] Field of Search ............... 372/34, 71, 36, 75, 372/6, 101, 102, 23

[56] References Cited

U.S. PATENT DOCUMENTS

| 4,399,541 | 8/1983 | Kovats et al. | 372/6 |
| 4,847,851 | 7/1989 | Dixon. | |
| 4,890,289 | 12/1989 | Basu et al. | 372/6 |
| 5,025,449 | 6/1991 | Yamamoto | 372/34 |

FOREIGN PATENT DOCUMENTS

0435217A2 7/1991 European Pat. Off. .

OTHER PUBLICATIONS

Patent Abstracts of Japan, vol. 11, No. 341 (E-554) [2788], Nov. 7, 1987; and JP-A-62 120 080 (NEC) Jan. 6, 1987.
Patent Abstracts of Japan, vol. 14, No. 348 (E-957) [6291], Jul. 27, 1990; and JP-A-2 122 581 (Toshiba) Oct. 5, 1990.
Optical Engineering, vol. 22, No. 2, Mar./Apr. 1983, pp. 247-255; G. Evans et al.: "Applications of Semiconductor Lasers in Space Communications".
Optics Letters, vol. 13, No. 4, Apr. 1988, pp. 306-308; J. Berger et al.: "Fiber-Bundle Coupled, Diode End-Pumped" ND; YAG Laser.

Primary Examiner—Léon Scott, Jr.
Attorney, Agent, or Firm—Limbach & Limbach

[57] ABSTRACT

An end pumped solid-state laser is comprised of a resonator formed of a pair of mirrors and a laser rod disposed between the pair of mirrors, an exciting light source for generating a pumping light which excites the laser rod and a converging optical element for converging the pumping light from the exciting light source so that the converged pumping light is irradiated on an end face of the laser rod. The wavelength of the light generated from the exciting light source is widened in band and/or a converging optical element having a large wavelength dispersion is employed, whereby heat generation in the optical axis direction of the laser rod is uniformed so as to generate a laser beam of large power.

14 Claims, 5 Drawing Sheets

END PUMPED SOLID-STATE LASER

BACKGROUND OF THE INVENTION

1. Field of the Invention

The present invention generally relates to laser generating apparatus and, more particularly, is directed to an end pumped solid-state laser.

2. Description of the Prior Art

A conventional end pumped solid-state laser is comprised of a resonator formed of a pair of mirrors and a laser rod (i.e., Nd:YAG laser rod), a laser diode for emitting a pumping light which excites the laser rod and a condenser lens for converging the pumping light from this pumping light source so that the converged light is irradiated on the end face of the laser rod.

When such laser generator is modified so as to generate a laser beam of large power, it is frequently observed that laser beams from a plurality of laser diodes are introduced into optical fibers forming an optical fiber bundle and the laser beam converged by this optical fiber bundle is irradiated through the condenser lens to the end face of the laser rod.

However, if the pumping light of large power is radiated on the end face of the laser rod, then temperature gradients of the radial and optical axis directions of the laser rod are increased to deteriorate the efficiency of the laser rod. Therefore, there is a limit on increasing the output power of the end pumped solid-state laser.

OBJECTS AND SUMMARY OF THE INVENTION

Accordingly, it is an object of the present invention to provide an improved end pumped solid-state laser in which the aforementioned shortcomings and disadvantages of the prior art can be eliminated.

More specifically, it is an object of the present invention to provide an end pumped solid-state laser in which a laser rod uniformly generates heat in the optical axis direction thereof so as to generate a laser beam of large power.

As an aspect of the present invention, an end pumped solid-state laser is comprised of a resonator formed of a pair of mirrors and a laser rod disposed between the pair of mirrors, an exciting light source for generating a pumping light which excites the laser rod and a converging optical element for converging the pumping light from the exciting light source so that the converged pumping light is irradiated on an end face of the laser rod. The wavelength of the light generated from the exciting light source is widened in band and/or a converging optical element having a large wavelength dispersion is employed, whereby heat generation in the optical axis direction of the laser rod is uniformed so as to generate a laser beam of large power.

The above and other objects, features, and advantages of the present invention will become apparent in the following detailed description of illustrative embodiments thereof to be read in conjunction with the accompanying drawings, in which like reference numerals are used to identify the same or similar parts in the several views.

DETAILED DESCRIPTION OF THE PREFERRED EMBODIMENTS

The present invention will now be described with reference to the accompanying drawings.

Figure 1:
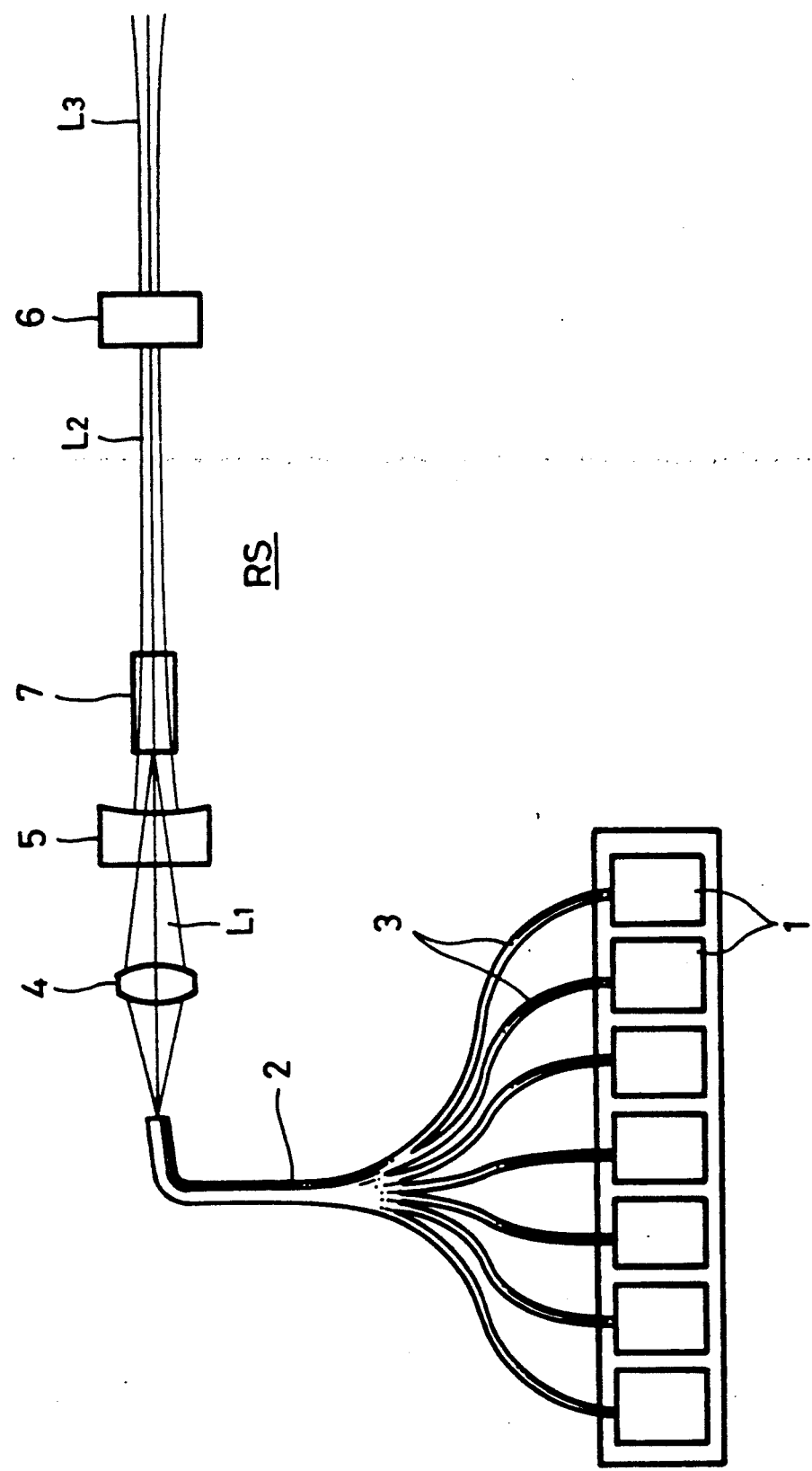
FIG. 1 is a schematic diagram showing an arrangement of an end pumped solid-state laser according to an embodiment of the present invention.

FIG. 1 generally shows an end pumped solid-state laser according to a first embodiment of the present invention. It will be seen in FIG. 1 that a laser resonator RS is comprised of a pair of opposing concave mirror (input mirror) 5 and plane mirror (output mirror) 6 and a columnar laser rod (Nd:YAG laser rod) 7 disposed between the concave mirror 5 and the plane mirror 6 so as to make its central axis become coincident with the optical axis.

Figure 2:
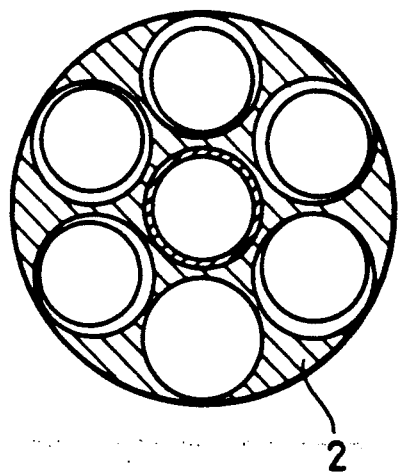
FIG. 2 is a cross-sectional view illustrating an example of an optical guide bundle used as an optical guide in the present invention.

Seven semiconductor lasers (i.e., laser diodes) 1 are provided to excite the laser rod 7 and laser beams from these laser diodes 1 are supplied to an optical fiber bundle 2 which is shown more fully in FIG. 2. As shown in FIG. 2, this optical fiber bundle 2 is composed of bundles of seven optical fibers 3 in response to the number of laser diodes, that is, seven in this embodiment. Output laser beams from the optical fiber bundle 2, i.e., a bundle of lights for laser pumping $L_1$ are converged by a condenser lens 4 and irradiated through the concave mirror 5 onto the laser rod 7 at a small area of the end face thereof.

In this embodiment, the condenser lens 4 might be a kinoform lens or a holographic element whose wavelength dispersion is large and therefore the pumping laser beam coincident with the optical axis of the laser rod 7 is focused at the position corresponding to the wavelength thereof within the laser rod 7.

Thus, the laser rod 7 generates a laser beam having its own wavelength by the excited beam. This laser beam is repeatedly propagated between the mirrors 5 and 6 in a reciprocal fashion, thereby a laser beam $L_2$ of the lateral mode conforming to the profile of the pumping light $L_1$ being generated. A part of the oscillated laser beam $L_2$ is passed through the mirror 6 and generated to the outside as an output laser beam $L_3$.

Figure 3:
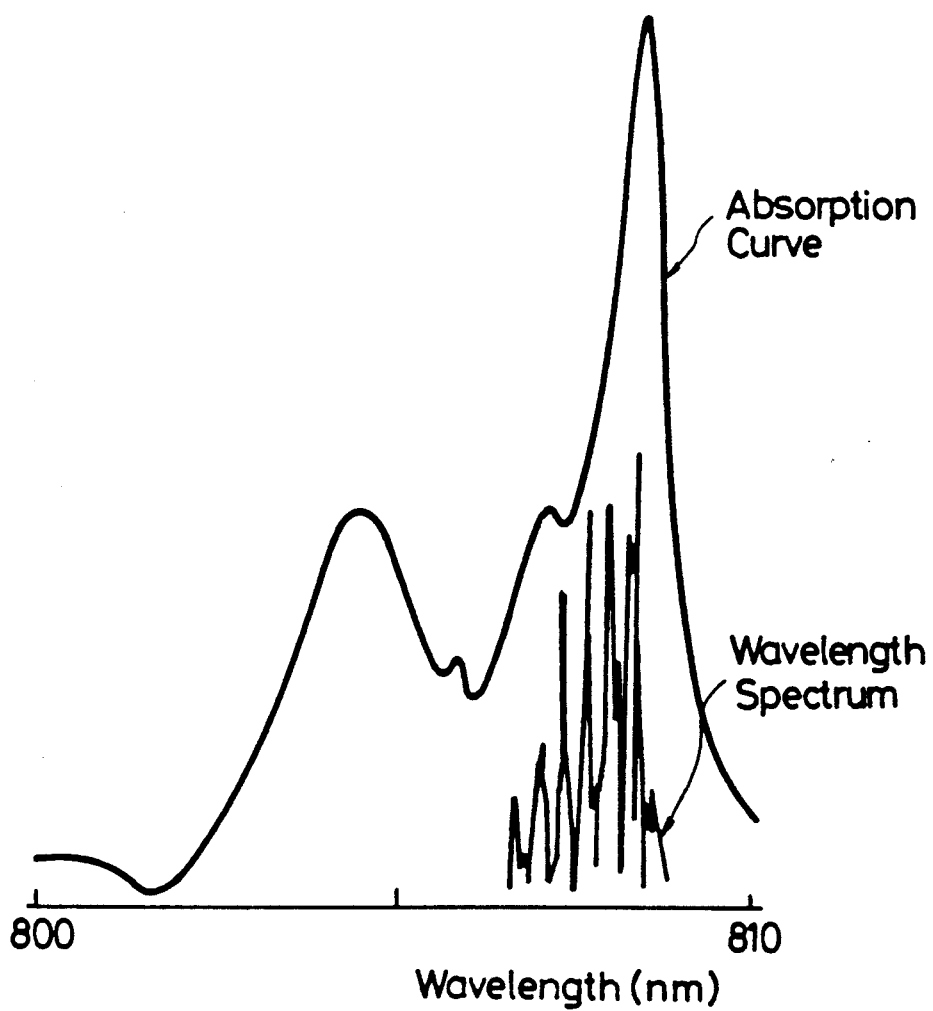
FIG. 3 is a graph graphing a wavelength spectrum of a laser diode and a heat absorbing characteristic of the laser rod.

FIG. 3 shows a wavelength spectrum of the laser beam generated from the laser diode 1 and a light absorption curve of $Nd^{+3}$ ion in the laser rod 7 of the Nd:YAG laser. As is clear from FIG. 3, the laser rod 7 has excellent light absorption relative to the laser beam having a wavelength of about 808 nm from the laser diode 1 and also has excellent light absorption relative to the laser beam having a wavelength of about 804 nm.

Figure 4:
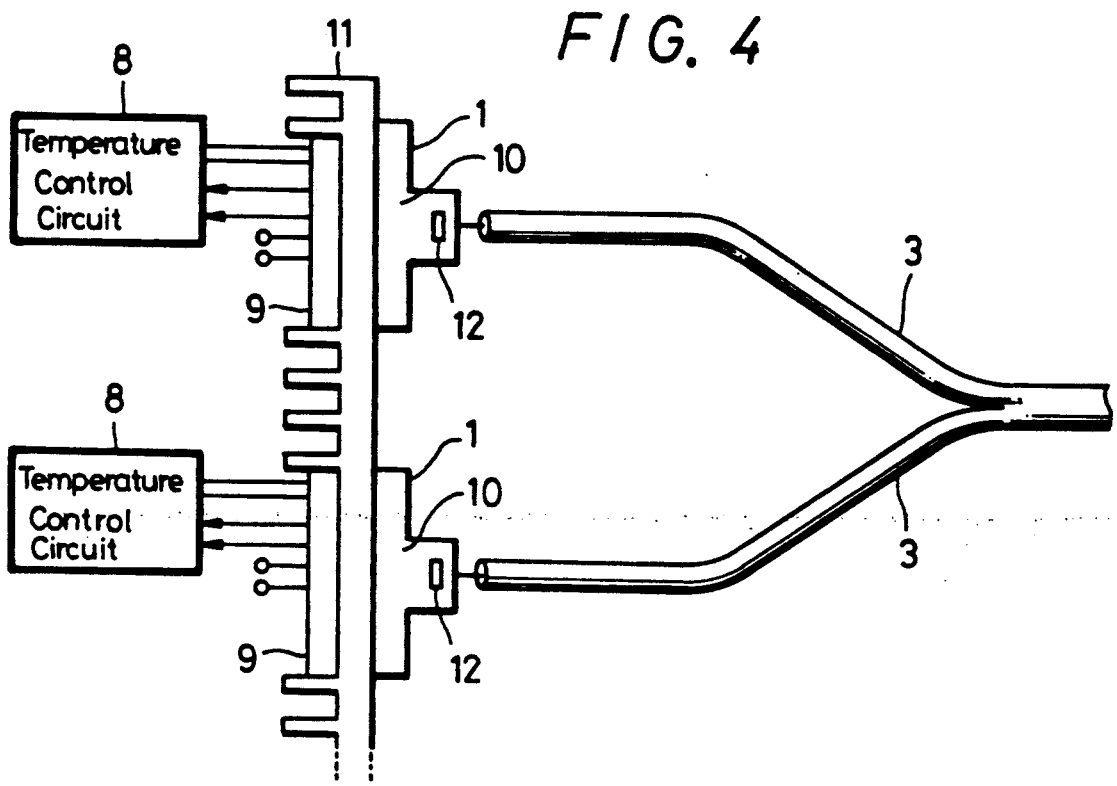
FIG. 4 a schematic diagram showing an example of a temperature control circuit for laser diode used in the present invention.

FIG. 4 shows an example of a temperature control circuit 8 which controls the temperature such that the wavelength of the oscillated light output from the laser diode 1 may fall within a predetermined range. In FIG. 4, like parts corresponding to those of FIG. 1 are marked with the same references and therefore need not be described in detail. In this embodiment, the temperature control circuit 8 is constructed such that a Peltier effect element 9 and a temperature sensor 10 are unitarily formed with the laser diode 1. When the rise of temperature in the laser diode 1 is detected by the temperature sensor 10, then the laser diode 1 is cooled by the Peltier effect element 9. In FIG. 4, reference numeral 11 designates a heat sink which is used to cool the laser diode 1 and reference numeral 12 designates a laser element. The temperature control circuits 8 having respective semiconductor lasers constructing the laser diodes 1 have setting temperatures which are slightly different from each other with the result that central wavelengths of the laser beams generated from a plurality of laser diodes 1 are deviated by these temperature control circuits 8. Accordingly, the band of the pumping laser beam generated from the optical fiber bundle 2 is widened so as to cover the absorbing band (800 nm to 810 nm) of $Nd^{3+}$ ion. Alternatively, in order to obtain the pumping laser beam whose band is widened, it is possible to employ a plurality of laser diodes which generate laser beams whose central wavelengths are different from each other.

If the band of the wavelength of the pumping laser beam is widened, then the converged points of laser beams of respective wavelengths on the laser rod optical axis are displaced so that, as compared with the case such that the band of the wavelength of the pumping laser beam is narrow, an average heat generation coefficient of $Nd^{3+}$ ion in the laser rod 7 is lowered. This is because it is avoided that the heat generation within the laser rod 7 is concentrated in the optical axis direction in response to the dispersion of the converged points.

Figure 5A:
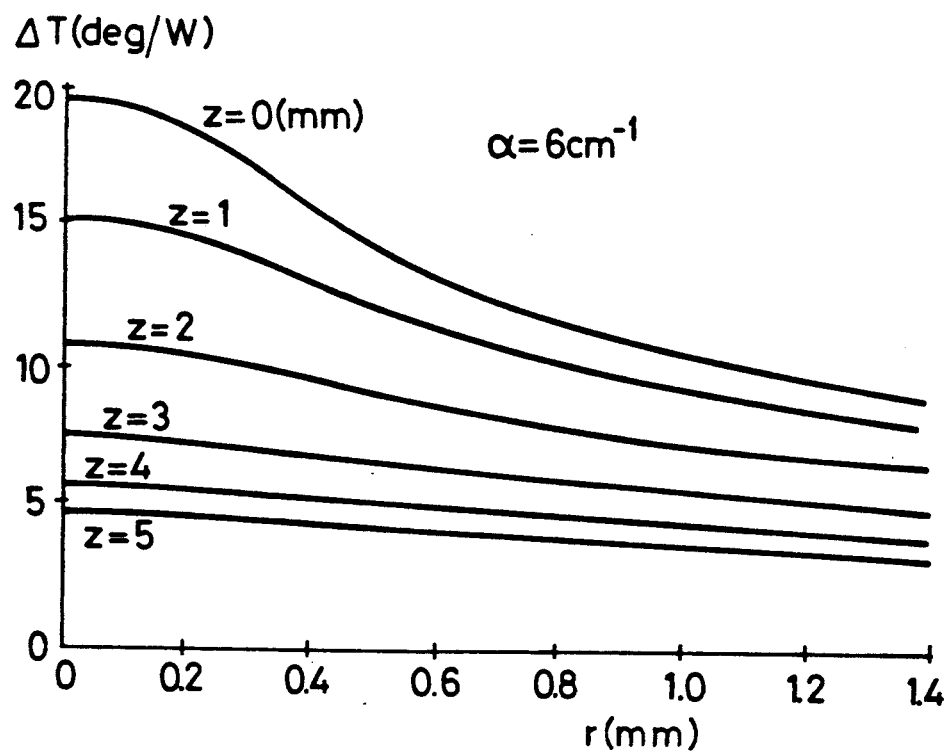
FIGS. 5A, 5B and 5C are graphs graphing temperature distribution of the laser rod and a schematic diagram.
Figure 5B:
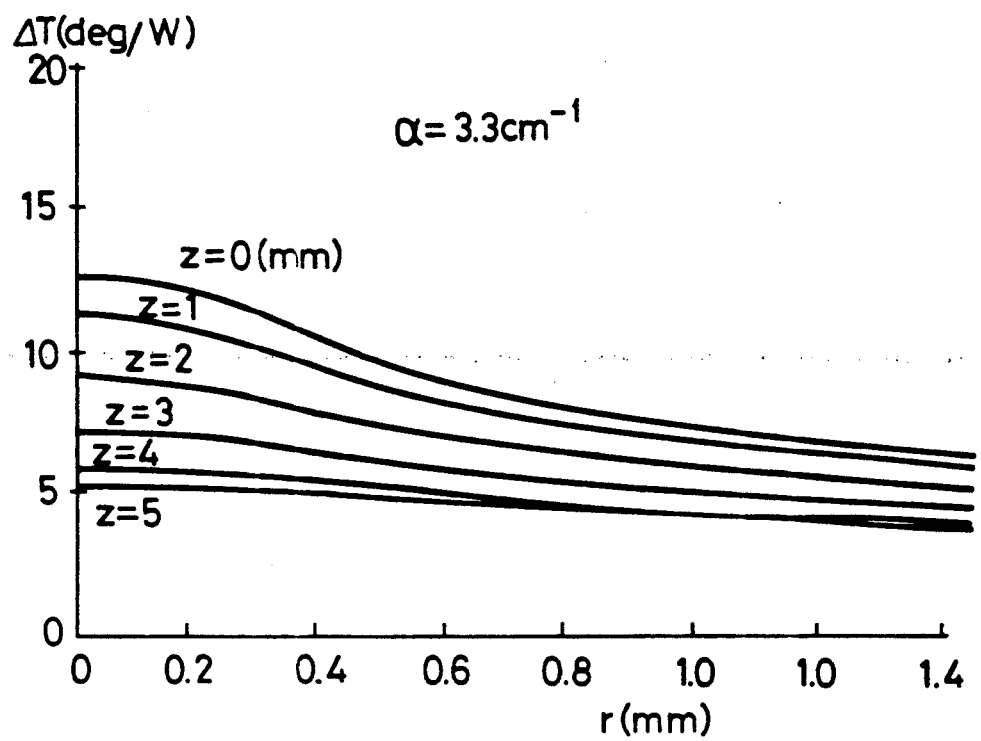
Figure 5C:
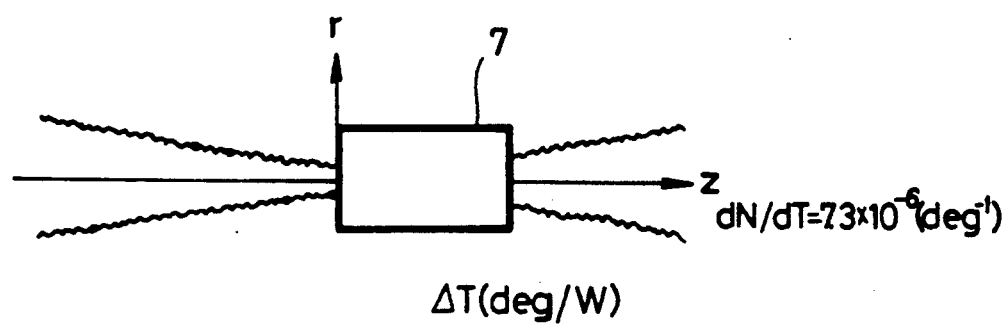

FIGS. 5A and 5B show simulation results of temperature distribution relative to the light absorption coefficient of the laser rod. More specifically, FIGS. 5A, 5B show simulation results in which temperature distributions in the position r of the radial direction in z=0, 1, 2, 3, 4, 5 mm are calculated by a simulation based on the finite-element method when the average light absorption coefficient α is 6 cm$^{-1}$ and 3.3 cm$^{-1}$ where r is the position of the radial direction of the laser rod 7 and z is the position of the laser rod 7 in the optical axis direction (central axis direction). In FIGS. 5A, 5B, ΔT on the ordinate represents the amount (°C.) of temperature raised per Watt by the pumping laser beam of the laser rod 7. In the equation shown in FIG. 5C, N represents the refractive index of the laser rod 7 and T represents the temperature (°C.), respectively.

From the temperature distribution curves in FIGS. 5A, 5B, it will be appreciated that the temperature gradient in the radial direction of the laser rod 7 becomes gentle in accordance with the increase of Z. In the above simulation, the deviation of the converged point of each wavelength of the pumping laser beam irradiated on the laser rod 7 is not taken into consideration. However, if a lens having a large wavelength dispersion (having strong wavelength dispersion) is utilized as the condenser lens 4, then it is possible to locate the converged point of each wavelength of the pumping laser beam on the optical axis.

In addition, if the central wavelengths of the laser beams generated from the plurality of laser diodes 1 are deviated, then the band of the pumping laser beam generated from the optical fiber bundle 2 can be widened. Therefore, by utilizing the lens whose wavelength dispersion is large as the condenser lens 4 which converges the pumping laser beam, the heat generation points of the laser rod 7 can be made more uniform.

Figure 6:
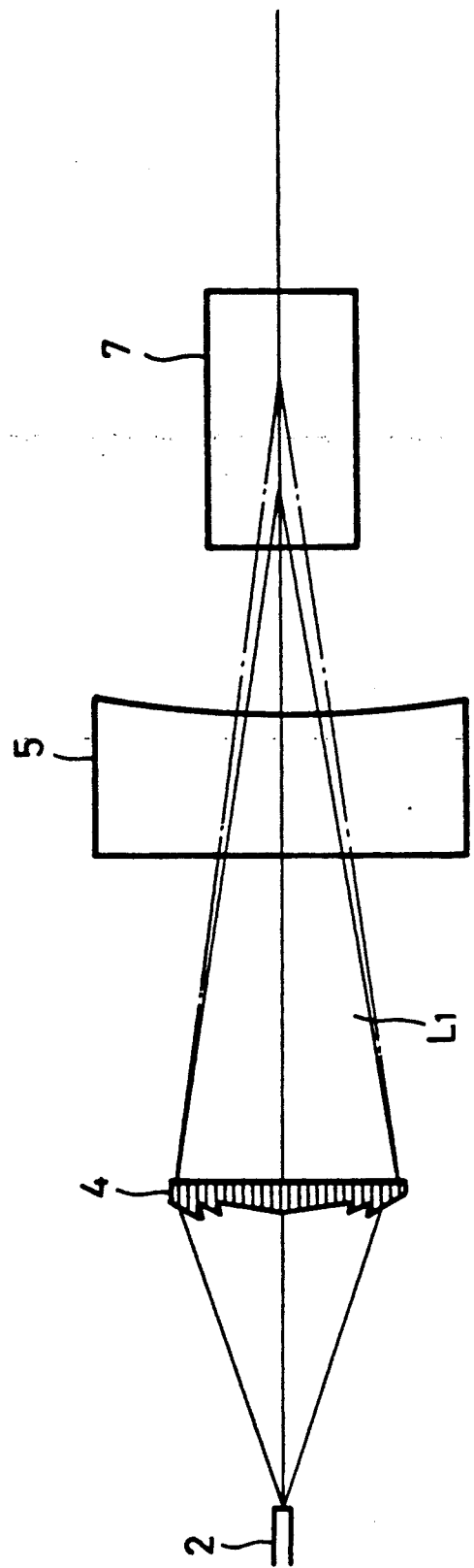
FIG. 6 is a schematic diagram showing the end pumped solid-state laser according to a second embodiment of the present invention.

FIG. 6 shows a second embodiment of the end pumped solid-state laser according to the present invention. In FIG. 6, like parts corresponding to those of FIG. 1 are marked with the same references and therefore need not be described in detail.

FIG. 6 shows a part of the end pumped solid-state laser according to the second embodiment of the present invention and, in this embodiment, the kinoform lens is utilized as the condenser lens 4 having a large wavelength dispersion.

The kinoform lens is a phase hologram lens which has coded informations as the change of the surface relief. A stereo-type kinoform lens has a configuration of Fresnel lens plate formed of rings whose optical thickness is changed in a quadratic function fashion and also whose optical thickness is changed by one wavelength each time it crosses each zone. The kinoform lens looks like well the Fresnel lens but they are not the same. The concavity and convexity of the kinoform lens has a height about twice the wavelength. Further, the kinoform lens makes effective use of light interference in different zones, while the Fresnel lens is adapted to bend a light. The surface configuration of the kinoform lens has the same function as a blaze angle on the diffraction grating. From a theory standpoint, the kinoform lens is different from the amplitude zone plate in which the efficiency is about 5% and has a quadratic function phase angle in which the efficiency is 100%. The above-mentioned explanation is based on Sinclair Optics Design Notes, 1990, Winter, Vol. 1, No. 1.

Assuming that Fr is the focal length when Λr represents the reference wavelength of the kinoform lens, then the focal length F in the wavelength Λ is given by the following equation (1):

$$1/F = (\Lambda/\Lambda r)(1/Fr) \quad (1)$$

The equation (1) yields the following equation (2) with respect to a focal length difference ΔF (=F−Fr) and a wavelength difference ΔΛ (=Λ−Λr).

$$\Delta F/F = -\Delta\Lambda/\Lambda r \quad (2)$$

Let it now be assumed that Λr=819 nm and that ΔΛ=−10 nm, then F=20 mm (Λ=Λr) may be satisfied in order to realize ΔF=0.25 mm.

Further, assuming that a magnification of the converging system is given as m=1.75, then the change of the image surface distance corresponding to ΔF=0.25 mm is given as ΔD=2 mm by the tracing of laser beam, which is about a half of the length 5 mm of the typical Nd:YAG laser rod 7. If the wavelength in the range of about 800 to 810 nm band of the laser beam from the laser diode 1 is shorter, then the light absorption coefficient of Nd in the Nd:YAG laser rod 7 is lowered more but the focal length is increased so that the converged point in which the pumping laser beam is converged on the optical axis of the laser rod 7 becomes distant. This is more convenient in order to uniform the heat generation point on the laser rod 7 from a spatial standpoint.

Furthermore, the converging optical element having large wavelength dispersion is not limited to the kinoform lens and might be diffraction grating such as the holographic element and so on.

Having described the preferred embodiments of the invention with reference to the accompanying drawings, it is to be understood that the invention is not limited to those precise embodiments and that various changes and modifications thereof could be effected by one skilled in the art without departing from the spirit or scope of the invention as defined in the appended claims.

What is claimed is:

1. An end pumped solid-state laser comprising:
   a resonator having a pair of mirrors and a laser rod disposed between said pair of mirrors, said laser rod having an optical axis, an end face, and a peak absorption wavelength;
   a pumping light source means for generating a pumping light to excite said laser rod by the absorption of the pumping light, the pumping light source means comprising a plurality of laser light sources producing laser light at a plurality of output wavelengths, said plurality of output wavelengths falling within a wavelength band around the peak absorption wavelength of said laser rod;
   an optical guide for guiding said pumping light from said exciting light source; and
   a converging optical element means for converging said pumping light guided by said optical guide and for irradiating said converged pumping light on said end face of said laser rod so as to excite said laser rod, the converging optical element having a large wavelength dispersion such that said plurality of wavelengths of laser light produced by said plurality of laser light sources are focused at a plurality of points on said optical axis of said laser rod, thereby reducing a density of heat generated within said laser rod.

2. An end pumped solid-state laser of claim 1 wherein said laser light sources are laser diodes.

3. An end pumped solid-state laser of claim 1 wherein each of said laser light sources includes a temperature sensor and a cooling circuit, wherein said output wavelength of each of said laser light sources varies in response to temperature, and further, wherein said cooling circuit is controlled in response to an output of said temperature sensor and said laser light source is maintained at a predetermined temperature.

4. An end pumped solid-state laser of claim 3 wherein a control temperature of at least one laser light source is different from those of other laser light sources, whereby the output wavelength of the laser light from said light source varies from that of said other sources, thereby broadening a wavelength band of said pumping light.

5. An end pumped solid-state laser of claim 1 wherein said optical guide is composed of a plurality of optical fibers in which laser beams from said laser light sources become incident on one ends of said optical fibers and the output laser light of said pumping light source is generated from the bundled other ends of said optical fibers.

6. An end pumped solid-state laser of claim 1 wherein said converging optical element is a kinoform lens.

7. An end pumped solid-state laser of claim 1 wherein said converging optical element is a diffraction grating.

8. An end pumped solid-state laser of claim 7 wherein said diffraction grating is a holographic element.

9. An end pumped solid-state laser comprising:
   a resonator having a pair of mirrors and a laser rod disposed between said pair of mirrors, said laser rod having an optical axis, an end face, and a peak absorption wavelength;
   a pumping light source means for generating a pumping light to excite said laser rod by the absorption of the pumping light, the pumping light source means comprising a plurality of laser light sources producing laser light at a plurality of output wavelengths, said plurality of output wavelengths falling within a wavelength band around the peak absorption wavelength of said laser rod;
   an optical guide for guiding said pumping light from said exciting light source; and
   a converging optical element means for converging said pumping light guided by said optical guide and for irradiating said converged pumping light on said end face of said laser rod so as to excite said laser rod, the converging optical element having a large wavelength dispersion such that said plurality of wavelengths of laser light produced by said plurality of laser light sources are focused at a plurality of points on said optical axis of said laser rod, thereby reducing a density of heat generated within said laser rod.

10. An end pumped solid-state laser of claim 9 wherein said light sources are laser diodes.

11. An end pumped solid-state laser of claim 9 wherein said optical guide is composed of a plurality of optical fibers in which laser beams from said laser light sources become incident on one ends of said optical fibers and the output laser light of said pumping light source is generated from the bundled other ends of said optical fibers.

12. An end pumped solid-state laser of claim 9 wherein said converging optical element is a kinoform lens.

13. An end pumped solid-state laser of claim 9 wherein said converging optical element is a diffraction grating.

14. An end pumped solid-state laser of claim 13 wherein said diffraction grating is a holographic element.

* * * * *